(12) United States Patent
Cho

(10) Patent No.: US 7,417,895 B2
(45) Date of Patent: Aug. 26, 2008

(54) NOR FLASH MEMORY AND ERASE METHOD THEREOF

(75) Inventor: Ji-Ho Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/602,004

(22) Filed: Nov. 20, 2006

(65) Prior Publication Data

US 2007/0171728 A1    Jul. 26, 2007

(30) Foreign Application Priority Data

Jan. 25, 2006    (KR) ...................... 10-2006-0007902

(51) Int. Cl.
    *G11C 11/34* (2006.01)
(52) U.S. Cl. ............................ 365/185.17; 365/185.24; 365/200
(58) Field of Classification Search ................. 365/200, 365/185.24
    See application file for complete search history.

(56) References Cited

U.S. PATENT DOCUMENTS

| | | | |
|---|---|---|---|
| 6,828,637 B2 | 12/2004 | Kim et al. | |
| 6,987,696 B1* | 1/2006 | Wang et al. | 365/185.29 |
| 2003/0198101 A1* | 10/2003 | Pio | 365/200 |
| 2004/0113199 A1 | 6/2004 | Hazama et al. | 257/317 |
| 2005/0041477 A1* | 2/2005 | Lee et al. | 365/185.29 |

FOREIGN PATENT DOCUMENTS

| | | |
|---|---|---|
| JP | 2001-210100 | 8/2001 |
| JP | 2004-127346 | 4/2004 |
| JP | 2005-063650 | 3/2005 |
| KR | 1020050021616 | 3/2005 |

OTHER PUBLICATIONS

Notice to File a Response/Amendment to the Examination Report for Korean Patent Application No. 2006-07902; dated Nov. 15, 2006.
English Translation of Notice to File a Response/Amendment to the Examination Report for Korean Patent Application No. 2006-07902; dated Nov. 15, 2006.

* cited by examiner

*Primary Examiner*—Michael T Tran
(74) *Attorney, Agent, or Firm*—Myers Bigel Sibley & Sajovec, P.A.

(57) ABSTRACT

A NOR flash memory includes a plurality of main cells, a plurality of main word lines, a plurality of dummy cells, and a plurality of dummy word lines. The main cells are electrically connected to a bit line and are arranged in a pattern. The main word lines are each electrically connected to a respective one of the main word lines. The dummy cells are electrically connected to the bit line and located adjacent to outermost ones of the main cells. The dummy word lines are each electrically connected to a respective one of the dummy cells. At least some of the dummy word lines form a first group that is supplied with a first erase voltage and at least some other ones of the dummy word lines form a second group that is supplied with a second erase voltage that is different from the first erase voltage.

17 Claims, 6 Drawing Sheets

NOR FLASH MEMORY AND ERASE METHOD THEREOF

CROSS-REFERENCE TO RELATED APPLICATIONS

This U.S. non-provisional patent application claims priority under 35 U.S.C § 119 of Korean Patent Application 2006-07902 filed on Jan. 25, 2006, the entire contents of which are hereby incorporated herein by reference.

BACKGROUND OF THE INVENTION

The present invention relates to flash memory devices and, more particularly, to NOR flash memory devices and related methods for erasing such devices.

Semiconductor memory devices are configured to retain previously stored data in the absence of power. Semiconductor memory devices may be categorized as random access memory (RAM) devices and read only memory (ROM) devices. A RAM device can be called a volatile memory because it loses stored data upon power-off. RAM devices can include dynamic RAM, static RAM, and the like. A ROM can be called a non-volatile memory because it can retain stored data upon power-off. ROM devices can include programmable ROM (PROM), erasable PROM (EPROM), electrically EPROM (EEPROM), flash memory, and the like.

Flash memories can be classified into NAND flash memory type devices and NOR flash memory type devices. A NAND flash memory can have a string structure in which a plurality of memory cells are connected in series to a bit line, while a NOR flash memory can have a structure in which a plurality of memory cells are connected in parallel to a bit line.

FIG. 1 is a cross-sectional view of a NOR flash memory cell. Referring to FIG. 1, a memory cell 10 has a source 1, a drain 2, a first insulating film 5, a floating gate 6, a second insulating film 7, and a control gate 8. The source 1 and the drain 2 are formed on a p-type substrate 3 so as to be spaced apart from each other.

The source 1 is connected to a source line SL, and the drain 2 is connected to a bit line BL. The floating gate 6 is formed on a channel region with the first insulating film 5 below 100 Angstroms interposed therebetween. The control gate 8 is formed on the floating gate 6 with the second insulating film 7 (referred to as an ONO film) interposed therebetween. The control gate 8 is connected to a word line WL. The substrate 3 is supplied with a bulk voltage BK. The source 1, the drain 2, the control gate 8 and the substrate 3 may be supplied with given bias voltages based on selected program, erase and read operations.

A NOR flash memory includes a cell array region in which memory cells in FIG. 1 are regularly arranged in two dimensions. The patterns in the cell array region may be formed using a photolithography process, which may result in memory cells along edges of the cell array region being deformed due to their proximity to the edges. Such deformed cells may give rise to non-uniform characteristics of all memory cells in the cell array region.

In an attempt to avoid the effects of memory cells proximate to cell array region edges, a dummy cell array region may be provided in a NOR flash memory so as to surround the cell array region. For purposes of description herein, the cell array region is referred to as a "main cell array region" to differentiate the dummy cell array region.

FIG. 2 is a cross-sectional view showing a part of a cell array region of a conventional NOR flash memory, and corresponds to FIG. 2 in U.S patent publication No. 2005-0041477. In FIG. 2, the cell array regions include a main cell array region and a dummy cell array region.

During an erase operation of the NOR flash memory in FIG. 2, a first erase voltage Ve1 (e.g., −10V) is applied to a main word line WL, and a second erase voltage Ve2 (e.g., +10V), which is higher than the first erase voltage Ve1, is applied to a p-well region 3 and a dummy word line WL'. In this case, main cells are insufficiently erased due to parasitic capacitance $C_{FG}$ between a main floating gate FG of a first main gate pattern G1 and a dummy floating gate FG' of a second dummy gate pattern G2'.

FIG. 3 is a cross-sectional view showing a part of another cell array region of the conventional NOR flash memory illustrated in FIG. 2. The cross-sectional view in FIG. 3 corresponds to FIG. 3 in U.S patent publication No. 2005-0041477. In FIG. 3, a symbol "Main" indicates a main cell array region, and symbols "Dummy1" and "Dummy2" indicate a first dummy cell array region and a second dummy cell array region, respectively.

During an erase operation of the NOR flash memory in FIG. 3, a first erase voltage Ve1 (e.g., −10V) is applied to a main word line MWL, a second erase voltage Ve2 (e.g. +10V), which is higher than the first erase voltage Ve1, is applied to a p-well region 53, and a third erase voltage Ve3 is applied to a dummy word line DWL. The third erase voltage Ve3 may be equal to the first erase voltage Ve1. Alternatively, the third erase voltage Ve3 may be higher than the first erase voltage Ve1 or may be lower than the second erase voltage Ve2.

With the cell array structure of the NOR flash memory in FIG. 3, during the erase operation, main cells MC2 to MCn-1 are normally erased through a well-known F-N tunneling scheme. Main cells MC1 and MCn may have an improved erase characteristic over the erase characteristic of the cell array region in FIG. 2. The improved erase characteristic may be associated with the third erase voltage Ve3 being lower than the second erase voltage Ve2. For example, because the first to fourth dummy word lines DWL1 to DWL4 are supplied with the third erase voltage Ve3 being equal to the first erase voltage Ve1 or lower than the second erase voltage Ve2, it may be possible to reduce the effects parasitic capacitance $C_{FG}$ described with regard to FIG. 2.

However, during fabrication processes to form the cell array structure of the NOR flash memory in FIG. 3, a coupling phenomenon may occur between word lines and/or a short-circuit phenomenon may occur through and/or circumventing one or more of the insulating films of each cell.

For example, assume that the third erase voltage Ve3 is equal to the first erase voltage Ve1, e.g., Ve3=Ve1=−10V. If a short-circuit phenomenon occurs between a substrate and an insulating film in each of outermost dummy gate patterns DG1 and DG4, during an erase operation, the p-well region 53 can be biased with a voltage lower than the second erase voltage Ve2 and the main word line MWL can be biased with a voltage higher than the first erase voltage Ve1, in which may result in the cells of the main cell array region not being sufficiently erased.

SUMMARY OF THE INVENTION

Some embodiments of the present invention are directed to a NOR flash memory that includes a plurality of main cells, a plurality of main word lines, a plurality of dummy cells, and a plurality of dummy word lines. The plurality of main cells are electrically connected to a bit line and are arranged in a pattern. The plurality of main word lines are each electrically connected to a respective one of the plurality of main word lines. The plurality of dummy cells are electrically connected to the bit line and located adjacent to outermost ones of the plurality of main cells. The plurality of dummy word lines are each electrically connected to a respective one of the plurality of dummy cells. At least some of the plurality of dummy word lines form a first group that is supplied with a first erase voltage and at least some other ones of the plurality of dummy word lines form a second group that is supplied with a second erase voltage that is different from the first erase voltage.

In some further embodiments, the first group of dummy word lines are electrically connected to first ones of the dummy cells that are adjacent of outermost ones of the plurality of main cells, and the main word lines and the first group of dummy word lines are both supplied with the first erase voltage.

In some further embodiments, the main cells and the dummy cells are on a bulk well region in a semiconductor substrate. The second group of dummy word lines are electrically connected to second ones of the dummy cells that are adjacent to the first ones of the dummy cells and are on an opposite side of the first ones of the dummy cells from the outermost ones of the main cells. The second group of dummy word lines are supplied with the same second erase voltage that is supplied to the bulk well region.

In some further embodiments, the second group of dummy word lines are electrically connected to second ones of the dummy cells that are adjacent to the first ones of the dummy cells and are on an opposite side of the first ones of the dummy cells from the outermost ones of the main cells. The second group of dummy word lines are set to a floating state.

In some other embodiments, a NOR flash memory includes a memory cell array, a plurality of main word lines, a plurality of dummy word lines, a first erase voltage generator circuit, and a second erase voltage generator circuit. The memory cell array includes a plurality of main cells electrically connected to a bit line and a plurality of dummy cells electrically connected to the bit line. The dummy cells are located adjacent to outermost ones of the main cells. The main cells and the dummy cells are on a bulk region of a substrate. The main word lines are electrically connected to the main cells. The dummy word lines are electrically connected to the dummy cells. The first erase voltage generator circuit is configured to supply the main word lines with a first erase voltage. The second erase voltage generator circuit is configured to supply the bulk region of the substrate with a second erase voltage higher than the first erase voltage. At least some of the dummy word lines are supplied with different erase voltages from one another. The first erase voltage may be a negative voltage, and the second erase voltage may be a positive voltage.

In some other embodiments, a method of erasing a NOR flash memory is provided. The NOR flash memory includes a plurality of main cells electrically connected to a bit line and arranged in a pattern, a plurality of main word lines each electrically connected to a respective one of the plurality of main word lines, a plurality of dummy cells electrically connected to the bit line and located adjacent to outermost ones of the plurality of main cells into a pattern, and a plurality of dummy word lines each electrically connected to a respective one of the plurality of dummy cells. The method of erasing includes providing a same erase voltage to the plurality of main word lines, and providing different erase voltages to at least some of the plurality of dummy word lines.

In some other embodiments of the present invention, a NOR flash memory comprises a plurality of main cells connected to a bit line, a plurality of main word lines connected to the plurality of main word lines, respectively, a plurality of dummy cells connected to the bit line and located outside of the plurality of main cells, and a plurality of dummy word lines connected to the plurality of dummy cells, respectively. The plurality of dummy word lines are supplied with different erase voltages from one another.

Some other embodiments of the present invention are directed to a method of erasing a NOR flash memory. The NOR flash memory includes a plurality of main cells connected to a bit line, a plurality of main word lines connected to the plurality of main word lines, respectively, a plurality of dummy cells connected to the bit line and located outside of the plurality of main cells, and a plurality of dummy word lines connected to the plurality of dummy cells, respectively. The method of erasing includes providing the same erase voltage to the plurality of main word lines, and providing different erase voltages to the plurality of dummy word lines.

DETAILED DESCRIPTION OF EMBODIMENTS

Figure 1:
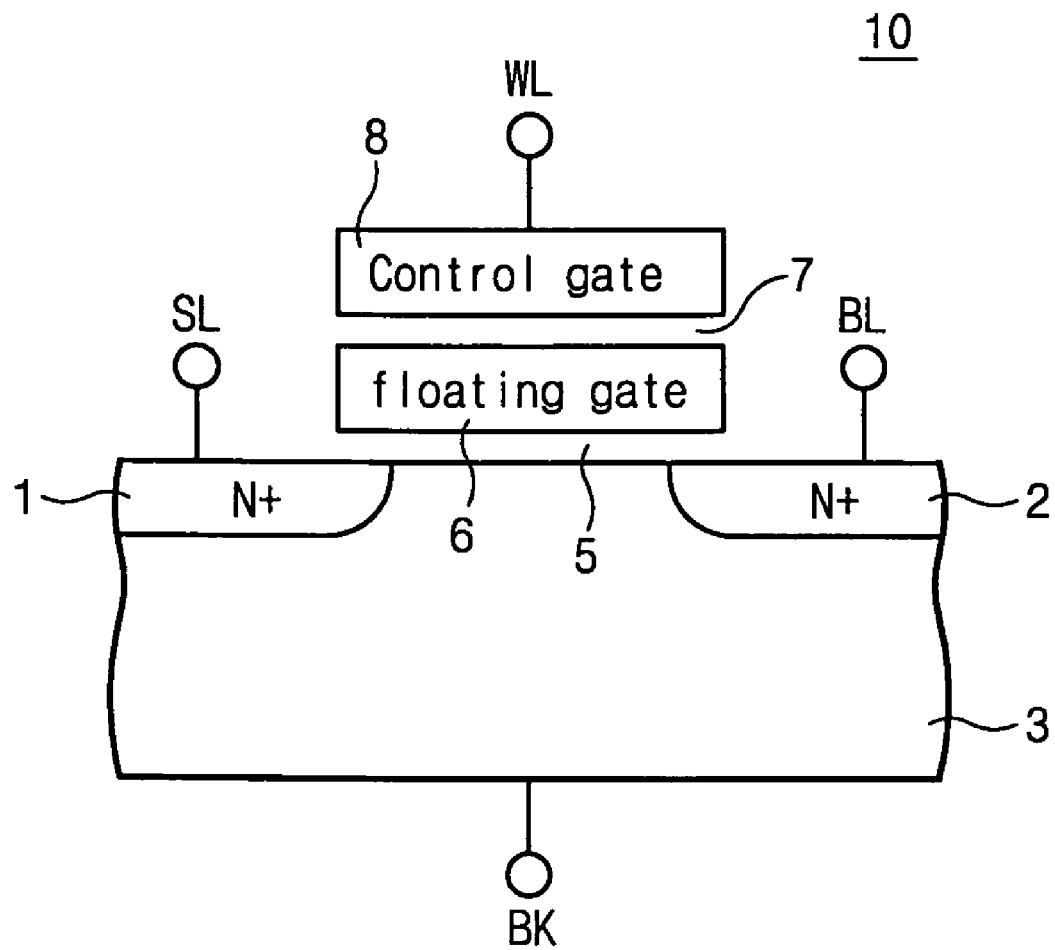
FIG. 1 is a cross-sectional view of a conventional NOR flash memory cell.
Figure 2:
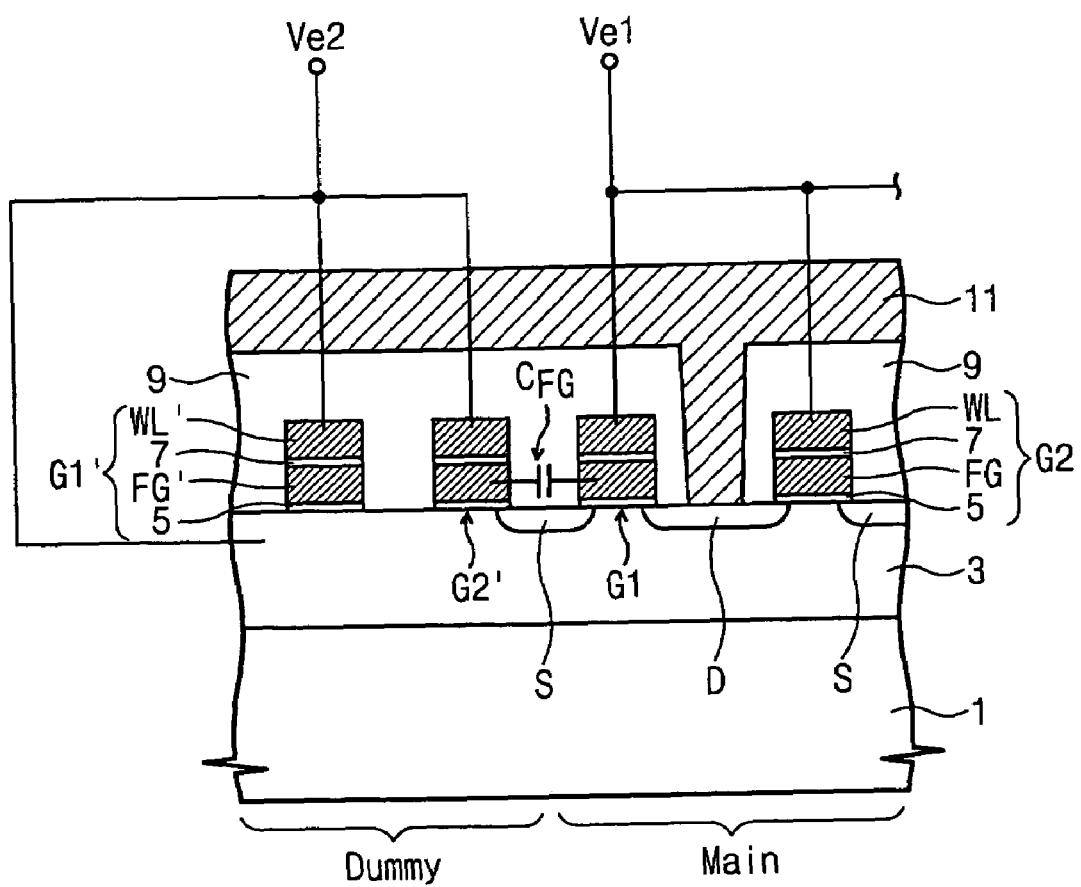
FIG. 2 is a cross-sectional view showing a part of a cell array region of a conventional NOR flash memory.
Figure 3:
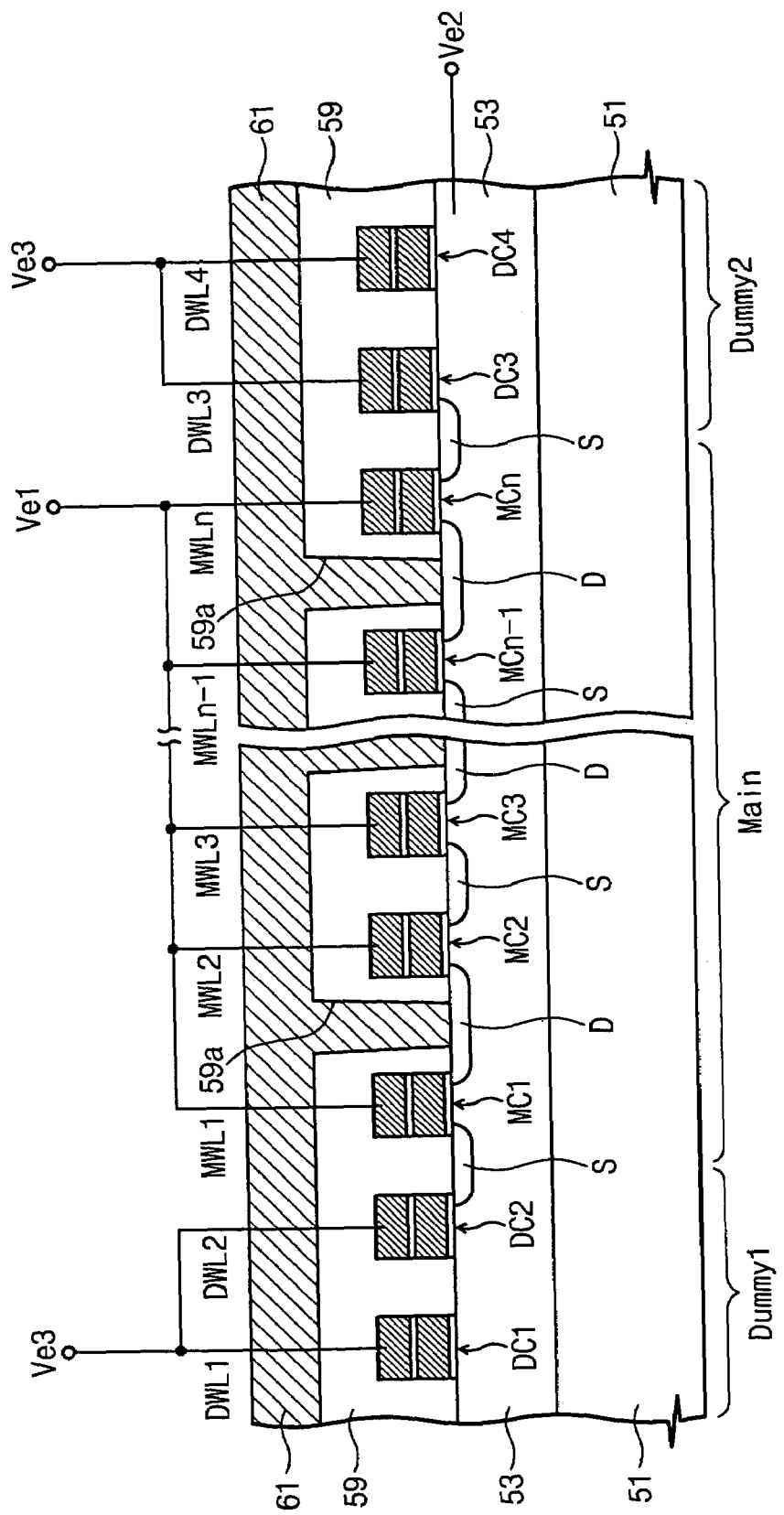
FIG. 3 is a cross-sectional view showing a part of a cell array region of the conventional NOR flash memory illustrated in FIG. 2.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 4:
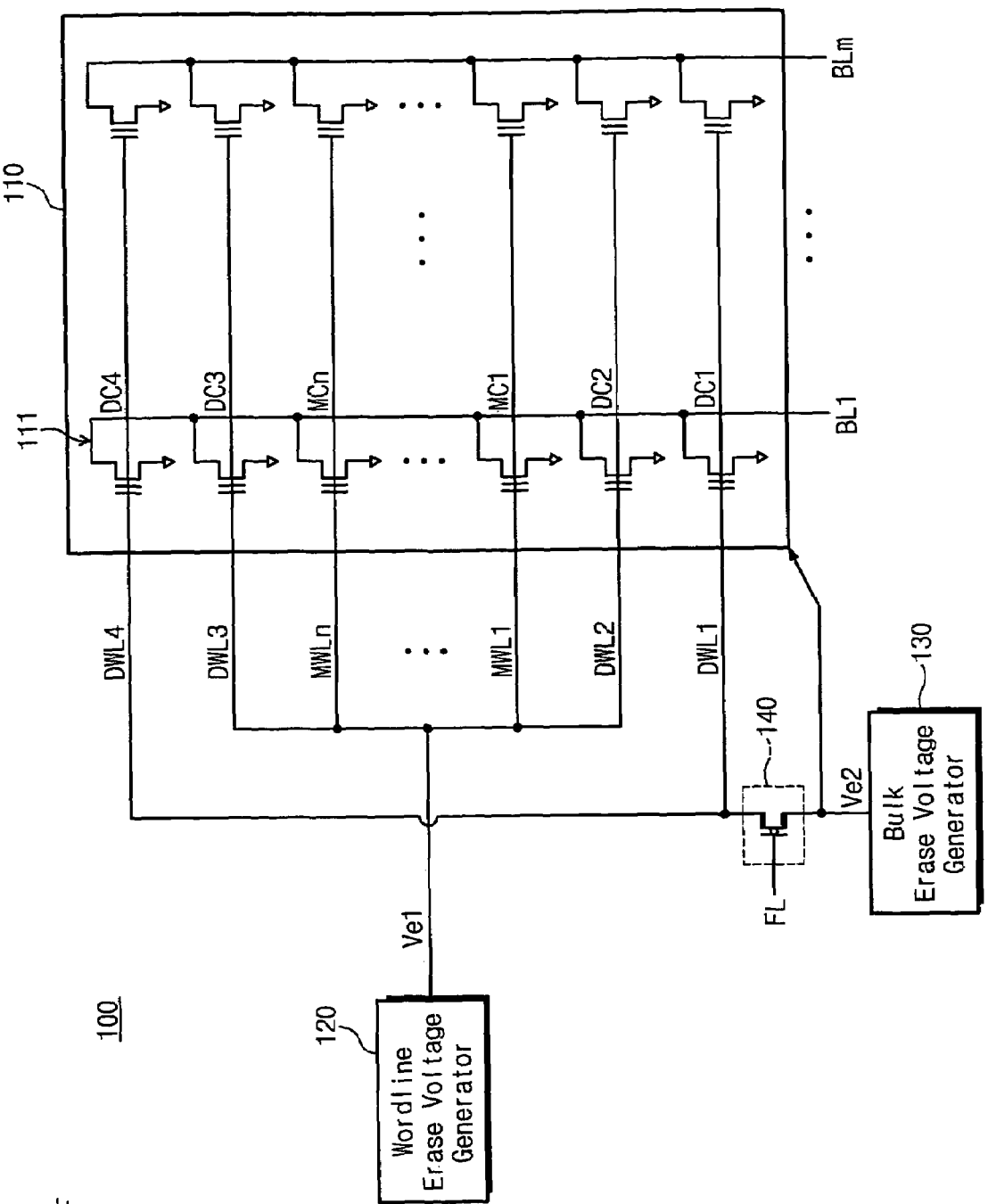
FIG. 4 is a block diagram showing a NOR flash memory and related methods according to some embodiments of the present invention.

FIG. 4 is a block diagram showing a NOR flash memory according to some embodiments of the present invention. Referring to FIG. 4, the NOR flash memory 100 includes a memory cell array 110, a word line erase voltage generator circuit 120, a bulk erase voltage generator circuit 130, and a selector circuit 140.

The memory cell array 110 includes a plurality of memory cells 111, which are connected to main word lines MWL1 to MWLn, dummy word lines DWL1 to DWL4, and bit lines BL1 to BLm. One bit line is coupled in parallel to the plurality of memory cells 111. The memory cells 111 include n main cells MC1 to MCn and four dummy cells DC1 to DC4. Although four dummy cells are illustrated in FIG. 4, it is to be understood that more or less dummy cells may be provided. During an erase operation, the bit lines BL1 to BLm may be set to a floating state.

In accordance with some embodiments of the present invention, during an erase operation of the NOR flash memory 100, an erase voltage Ve1 is supplied to main word lines and to dummy word lines DWL2 and DWL3 which are adjacent to main word lines MWL1 and MWLn. Other outermost dummy word lines DWL1 and DWL4 are electrically separated from the dummy word lines DWL2 and DWL3 and are supplied with a voltage that is different from that supplied to the dummy word lines DWL2 and DWL3. For example, the outermost dummy word lines DWL1 and DWL4 may be supplied with a bulk erase voltage Ve2 or set to a floating state. In this manner, it may be possible to reduce the effects of parasitic capacitance between, for example, a main cell MC1 and a dummy cell DC2. Moreover, the use of dummy word lines, such as dummy word line DWL2, may avoid a short-circuit phenomenon from occurring between one or more main cells, such as main cell MC1, and an adjacent outermost dummy cell, such dummy cell DC1, and so that main cells may be sufficiently erased during an erasure operation.

With continuing reference to FIG. 4, the word line erase voltage generator 120 is configured to supply a first erase voltage Ve1 (e.g., −10V) to main word lines MWL1 to MWLn during an erase operation. The word line erase voltage generator 120 is configured to supply the first erase voltage Ve1 to dummy word lines DWL2 and DWL3 that are immediately adjacent to the main word lines MWL1 and MWLn, which may reduce or remove effects of parasitic capacitance between the main word line MWL1 and the dummy word line DWL2 or between the main word line MWLn and the dummy word line DWL3.

The bulk erase voltage generator circuit 130 is configured to supply a second erase voltage Ve2 (e.g., +10V) to a bulk region of the memory cell array 110 during an erase operation. For example, the bulk erase voltage generator circuit 130 is configured to supply the second erase voltage Ve2 to the outermost dummy word lines DWL1 and DWL4 through the selector circuit 140. Because the second erase voltage Ve2 is supplied to the outermost dummy word lines DWL1 and DWL4, effects of parasitic capacitance may appear between the dummy word lines, such as between, for example, DWL1 and DWL2 and/or between DWL3 and DWL4. On the other hand, such parasitic capacitance may not affect voltage levels of the main word lines MWL1-MWLn.

Figure 5:
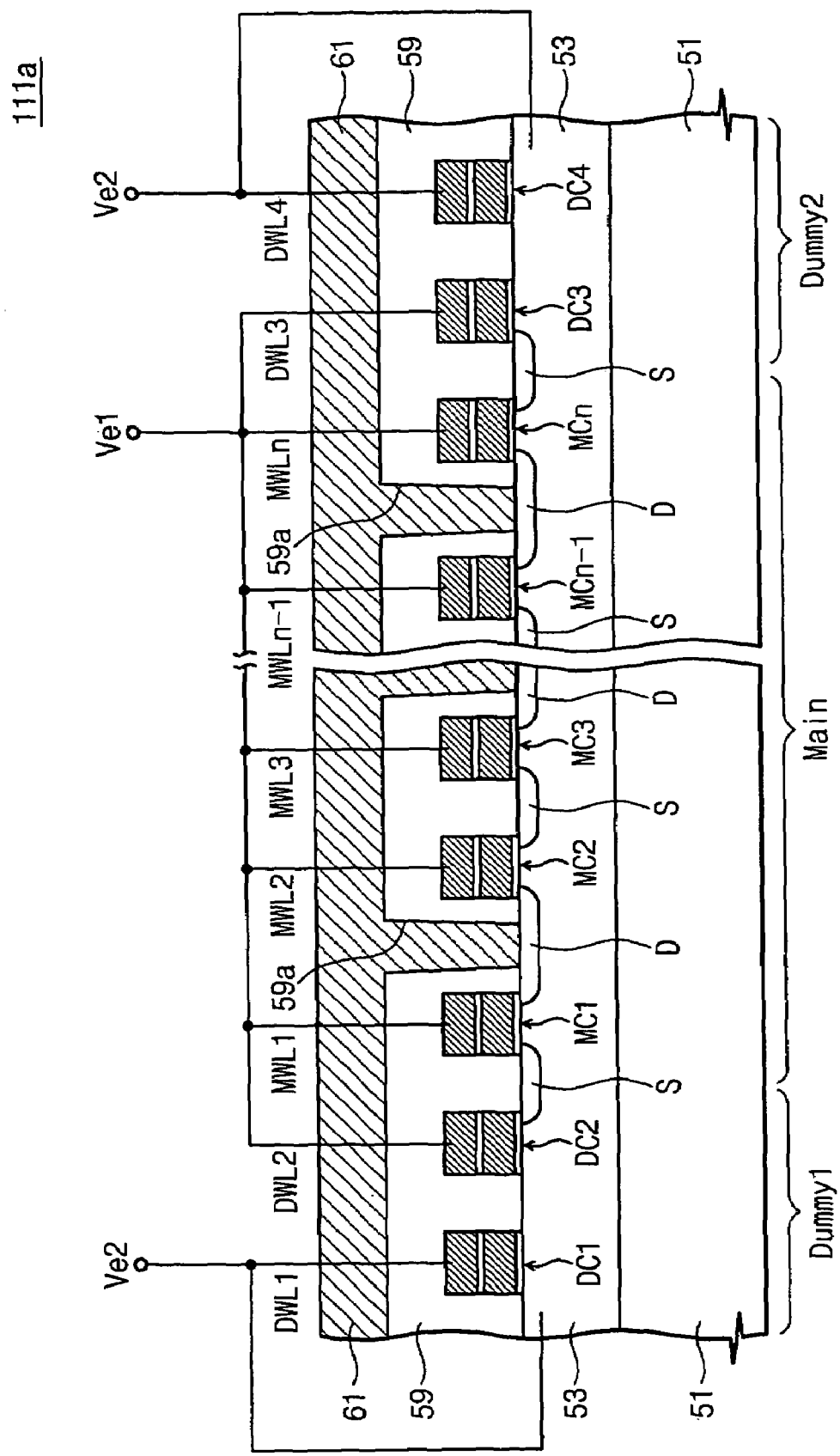
FIG. 5 shows a bias condition of a memory cell array and related methods when a control signal is at a low level according to some embodiments of the present invention.

The selector circuit 140 is configured to respond to a control signal FL by selectively connecting and disconnecting (i.e., electrically passing or blocking) an output of the bulk erase voltage generator circuit 130 to the outermost dummy word lines DWL1 and DWL4. When the control signal FL is at a high level, the output of the bulk erase voltage generator circuit 130 is disconnected from the outermost dummy word lines DWL1 and DWL4, and so that the outermost dummy word lines DWL1 and DWL4 are floated. In contrast, when the control signal FL is at a low level, the output of the bulk erase voltage generator circuit 130 is connected to the outermost dummy word lines DWL1 and DWL4, and so that the outermost dummy word lines DWL1 and DWL4 are supplied with the second erase voltage Ve2 from the circuit 130. FIG. 5 shows a cross-section of the memory cells when biased with the control signal FL at a low level, and FIG. 6 shows a cross-section of the memory cells when biased with the control signal FL at a high level.

Figure 6:
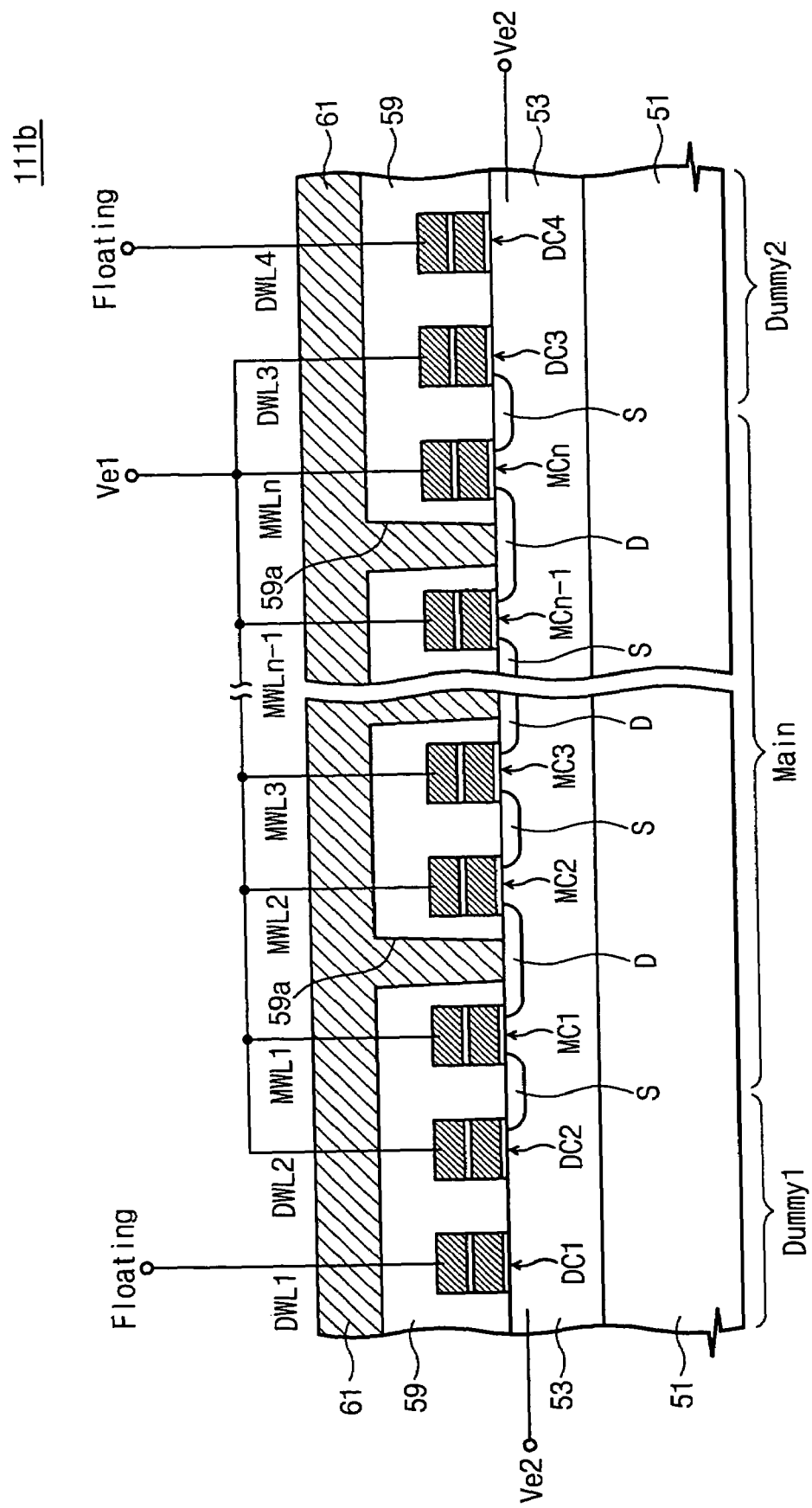
FIG. 6 shows a bias condition of a memory cell array and related methods when a control signal is at a high level according to some embodiments of the present invention.

Referring to FIGS. 5 and 6, one bit line 61 (e.g., BL1 in FIG. 4) is connected with plural memory cells DC1 to DC4 and MC1 to MCn. Each of memory cell regions 111a and 111b includes a main memory cell region "Main" and first and second dummy memory cell regions "Dummy1" and "Dummy2", which are formed on a p-well region of a semiconductor substrate 51. The main region Main includes a first main cell MC1 to an nth main cell MCn. The first dummy region Dummy1 includes first and second dummy cells DC1 and DC2, and the second dummy region Dummy2 includes third and fourth dummy cells DC3 and DC4. Source regions S, drain regions D, the p-well region 53, and the memory cells DC1 to DC4 and MC1 to MCn are covered by an interlayer insulating film 59. The bit line 61 is disposed on the interlayer insulating film 59. The bit line 61 is electrically connected to drain regions D through bit line contact holes 59a that are formed to penetrate the interlayer insulating film 59. Although not shown in FIG. 5, the source regions S may be interconnected through a common source line.

The first and second dummy cells DC1 and DC2 are formed within the first dummy region Dummy1, and the third and fourth dummy cells DC3 and DC4 are formed within the second dummy region Dummy2. The first to nth main cells MC1 to MCn are connected with first to nth main word lines MWL1 to MWLn, respectively, and the first to fourth dummy cells DC1 to DC4 are connected with first to fourth dummy word lines DWL1 to DWL4, respectively.

As illustrated in FIG. 5, during an erase operation, the first erase voltage Ve1 (e.g., −10V) can be simultaneously supplied to the word lines MWL1 to MWLn, DWL2 and DWL3, and the second erase voltage Ve2 (e.g., +10V) is supplied to the dummy word lines DWL1 and DWL4. Herein, the second erase voltage Ve2 is a bulk voltage applied to the p-well region 53.

As illustrated in FIG. 6, during an erase operation, the first erase voltage Ve1 (e.g., −10V) can be simultaneously supplied to the word lines MWL1 to MWLn, DWL2 and DWL3, and the dummy word lines DWL1 and DWL4 are set to a floating state. On or about at the same time, the second erase voltage Ve2 (e.g., +10V) is supplied to the p-well region 53

As understood from FIGS. 5 and 6, the NOR flash memory 100, in accordance with some embodiments of the present invention, is configured to supply the second and third dummy word lines DWL2 and DWL3 with the same voltage as the erase voltage that is applied to the main word lines MWL1 to MWLn. In this case, the remaining dummy word lines DWL1 and DWL4 can be set to a floating state or biased with the same voltage as the erase voltage applied to the bulk, that is, the p-well region 53.

As set forth above, the NOR flash memory according some embodiments of the present invention may reduce or prevent effects due to parasitic capacitance, and/or may facilitate efficient erasure of a memory cell when a short-circuit condition exists between an outermost dummy word line and a bulk (e.g., p-well region), by setting dummy word lines to different bias conditions.

Although the present invention has been described in connection with various embodiments that are described herein and illustrated in the accompanying drawings, it is not limited thereto. It will be apparent to those skilled in the art in view of the present description and illustrations that various substitutions, modifications, and changes may be made thereto without departing from the scope and spirit of the invention.

What is claimed is:

1. A NOR flash memory comprising:
a plurality of main cells electrically connected to a bit line and arranged in a pattern;
a plurality of main word lines, each electrically connected to a respective one of the plurality of main cells;
a plurality of dummy cells electrically connected to the bit line and located adjacent to outermost ones of the plurality of main cells in the pattern; and
a plurality of dummy word lines, each electrically connected to a respective one of the plurality of dummy cells, wherein at least some of the plurality of dummy word lines form a first group that is supplied with a first erase voltage and at least some other ones of the plurality of dummy word lines form a second group that is supplied with a second erase voltage that is different from the first erase voltage, wherein the first group of dummy word lines are electrically connected to first ones of the dummy cells that are adjacent to the outermost ones of the plurality of main cells, and the main word lines and the first group of dummy word lines are both supplied with the first erase voltage.

2. The NOR flash memory of claim 1, wherein:
the main cells and the dummy cells are on a bulk region in a semiconductor substrate;
the second group of dummy word lines are electrically connected to second ones of the dummy cells that are adjacent to the first ones of the dummy cells and are on an opposite side of the first ones of the dummy cells from the outermost ones of the plurality of main cells; and
the second group of dummy word lines are supplied with the same second erase voltage that is supplied to the bulk region in the substrate.

3. The NOR flash memory of claim 1, wherein:
the second group of dummy word lines are electrically connected to second ones of the dummy cells that are adjacent to the first ones of the dummy cells and are on an opposite side of the first ones of the dummy cells from the outermost ones of the plurality of main cells; and
the second group of dummy word lines are set to a floating state.

4. A NOR flash memory comprising:
a memory cell array including a plurality of main cells electrically connected to a bit line and a plurality of dummy cells electrically connected to the bit line, wherein the plurality of dummy cells are located adjacent to outermost ones of the plurality of main cells, and the plurality of main cells and plurality of dummy cells are on a bulk region in a substrate;
a plurality of main word lines electrically connected to the plurality of main cells;
a plurality of dummy word lines electrically connected to the plurality of dummy cells;
a first erase voltage generator circuit configured to supply the plurality of main word lines with a first erase voltage;
a second erase voltage generator circuit configured to supply the bulk region in the substrate with a second erase voltage higher than the first erase voltage,
wherein at least some of the plurality of dummy word lines are supplied with different erase voltages from one another; and
a selector circuit electrically connected between the second erase voltage generator circuit and second ones of the plurality of dummy word lines that are adjacent to the first ones of the plurality of dummy word lines and are on an opposite side of the first ones of the plurality of dummy word lines from the plurality of main word lines, and configured to selectively supply the second erase voltage to the second ones of the plurality of dummy word lines.

5. The NOR flash memory of claim 4, wherein the first erase voltage is a negative voltage.

6. The NOR flash memory of claim 5, wherein the second erase voltage is a positive voltage.

7. The NOR flash memory of claim 4, wherein the first erase voltage is supplied to first ones of the plurality of dummy word lines that are adjacent to the plurality of main word lines.

8. The NOR flash memory of claim 7, wherein the second erase voltage is supplied to second ones of the plurality of dummy word lines that are adjacent to the first ones of the plurality of dummy word lines and are on an opposite side of the first ones of the plurality of dummy word lines from the plurality of main word lines.

9. The NOR flash memory of claim 7, wherein second ones of the plurality of dummy word lines are set to a floating state, wherein the second ones of the dummy word lines are adjacent to the first ones of the plurality of dummy word lines and are on an opposite side of the first ones of the plurality of dununy word lines from the plurality of main word lines.

10. The NOR flash memory of claim 4, wherein the selector circuit is configured to set the second ones of the plurality of dummy word lines to a floating state in response to a control signal.

11. The NOR flash memory of claim 4, wherein the selector circuit comprises a MOS transistor with a gate and configured to respond to a control signal applied to the gate by forming a current path between the second ones of the plurality of dummy word lines and the second erase voltage generator circuit.

12. A method of erasing a NOR flash memory which comprises a plurality of main cells electrically connected to a bit line and arranged in a pattern, a plurality of main word lines each electrically connected to a respective one of the plurality of main cells, a plurality of dummy cells electrically connected to the bit line and located adjacent to outermost ones of the plurality of main cells in the pattern, and a plurality of dummy word lines each electrically connected to a respective one of the plurality of dummy cells, a first group of the dummy word lines are electrically connected to first ones of the dummy cells that are adjacent to outermost ones of the plurality of main cells, and a second group of the dummy word lines are electrically connected to second ones of the dummy cells that are adjacent to the first ones of the dummy cells and are on an opposite side of the first ones at the dummy cells from the outermost ones of the plurality of main cells, the method further comprising:
providing a same erase voltage to the plurality of main word lines;
providing different erase voltages to at least some of the plurality of dummy word lines;
supplying a first erase voltage to the plurality of main word lines and to the first group of the dummy word lines; and
supplying a second erase voltage higher than the first erase voltage to the second group of dummy word lines.

13. The erase method of claim 12, wherein the first erase voltage is a negative voltage.

14. The erase method of claim 13, wherein the second erase voltage is a positive voltage.

15. The erase method of claim 14, wherein the plurality of main cells and the plurality of dummy cells are on a bulk region in a substrate, and supplying a second erase voltage comprises supplying the second erase voltage to the bulk region in the substrate during an erase operation.

16. A method of erasing a NOR flash memory which comprises a plurality of main cells electrically connected to a bit line and arranged in a pattern, a plurality of main word lines each electrically connected to a respective one of the plurality of main cells, a plurality of dummy cells electrically connected to the bit line and located adjacent to outermost ones of the plurality of main cells in the pattern, and a plurality of dummy word lines each electrically connected to a respective one of the plurality of dummy cells, the plurality of main cells and the plurality of dummy cells are on a bulk region in a substrate, the method comprising:
supplying a first erase voltage to the plurality of main word lines and to first ones of the dummy word lines that are adjacent to the plurality of main word lines;
setting second ones of the dummy word lines to a floating state, the second ones of the dummy word lines are adjacent to the first ones of the dummy word lines and are on an opposite side of the first ones of the dummy word lines from the plurality of main word lines; and
supplying a second erase voltage higher than the first erase voltage to the bulk region in the substrate.

17. The erase method of claim 16, wherein the first erase voltage is a negative voltage and the second erase voltage is a positive voltage.

* * * * *